United States Patent
Binder et al.

(10) Patent No.: US 10,907,991 B2
(45) Date of Patent: Feb. 2, 2021

(54) MAGNETIC SENSOR DEVICE AND METHOD FOR DETERMINING A ROTATION SPEED, A DIRECTION OF ROTATION, AND/OR A ROTATION ANGLE OF A MAGNETIC COMPONENT ABOUT A ROTATION AXIS

(71) Applicant: Infineon Technologies AG, Neubiberg (DE)

(72) Inventors: Gernot Binder, Klagenfurt (AT); Armin Satz, Villach (AT)

(73) Assignee: Infineon Technologies AG

( * ) Notice: Subject to any disclaimer, the term of this patent is extended or adjusted under 35 U.S.C. 154(b) by 27 days.

(21) Appl. No.: 16/129,198

(22) Filed: Sep. 12, 2018

(65) Prior Publication Data
US 2019/0086236 A1  Mar. 21, 2019

(30) Foreign Application Priority Data
Sep. 15, 2017  (DE) .................. 10 2017 121 467

(51) Int. Cl.
*G01D 5/14* (2006.01)
*G01B 7/00* (2006.01)
(Continued)

(52) U.S. Cl.
CPC .............. *G01D 5/147* (2013.01); *G01B 7/003* (2013.01); *G01P 3/487* (2013.01); *G01R 33/07* (2013.01); *G01R 33/091* (2013.01)

(58) Field of Classification Search
CPC ...... G01D 5/147; G01R 33/091; G01R 33/07; G01P 3/487; G01B 7/003; G04C 5/00; H02K 49/102
See application file for complete search history.

(56) References Cited

U.S. PATENT DOCUMENTS 5,359,287 A   10/1994  Watanabe et al.
5,814,985 A   9/1998   Oudet
(Continued)

FOREIGN PATENT DOCUMENTS

CN   1503230 A   6/2004
CN   1902498 A   1/2007
(Continued)

OTHER PUBLICATIONS

Qingfend, Meng, "Design of direction discernible gear sensor based on GMR", Dissertation, Hangzhou Dianzi University, 2012.

*Primary Examiner* — Nasima Monsur
(74) *Attorney, Agent, or Firm* — Design IP (57) ABSTRACT

A magnetic sensor device for determining a rotation speed, a direction of rotation, and/or a rotation angle of a magnetic component rotating about a rotation axis is provided. The magnetic sensor device includes a magnet being rotationally symmetrical with respect to a symmetry axis, wherein a recess is formed within the magnet along the symmetry axis. Further, the magnetic sensor device includes a first magnetic sensor element arranged within the recess and on the symmetry axis, and a second magnetic sensor element arranged within the recess and on the symmetry axis. The magnetic sensor device additionally includes an integrated circuit arranged within the recess and configured to determine the rotation speed, the direction of rotation, and/or the rotation angle of the magnetic component based on a first output signal of the first magnetic sensor element and a second output signal of the second magnetic sensor element.

24 Claims, 4 Drawing Sheets

(51) Int. Cl.
*G01P 3/487* (2006.01)
*G01R 33/07* (2006.01)
*G01R 33/09* (2006.01)

(56) References Cited

U.S. PATENT DOCUMENTS

| | | | |
|---|---|---|---|
| 6,954,063 B2 | 10/2005 | Kinpara et al. | |
| 6,977,497 B1 | 12/2005 | Yokotani et al. | |
| 7,253,613 B2 | 8/2007 | Tokuhara | |
| 7,425,824 B2 | 9/2008 | Busch | |
| 7,582,489 B2 | 9/2009 | Ao et al. | |
| 7,615,994 B2 | 11/2009 | Butzmann | |
| 8,736,258 B2 | 5/2014 | Trontelj | |
| 8,749,229 B2 | 6/2014 | Naganuma et al. | |
| 9,000,763 B2 | 4/2015 | Ausserlechner | |
| 9,857,438 B2 | 1/2018 | Werth | |
| 2004/0251896 A1 | 12/2004 | Mizutani et al. | |
| 2006/0082364 A1* | 4/2006 | Kurumado | G01D 5/147 324/207.21 |
| 2007/0194786 A1* | 8/2007 | Hatanaka | G01D 5/145 324/207.25 |
| 2008/0272771 A1* | 11/2008 | Guo | B82Y 25/00 324/260 |
| 2009/0322325 A1* | 12/2009 | Ausserlechner | G01D 5/145 324/260 |
| 2011/0080162 A1* | 4/2011 | Steinich | G01D 5/2452 324/207.25 |
| 2011/0187359 A1 | 8/2011 | Werth et al. | |
| 2013/0278246 A1* | 10/2013 | Stegerer | G01R 33/09 324/207.12 |
| 2015/0022187 A1 | 1/2015 | Taylor | |
| 2016/0041235 A1 | 2/2016 | Ausserlechner et al. | |
| 2017/0227613 A1 | 8/2017 | Bachleitner Hofmann | |
| 2020/0049528 A1 | 2/2020 | Ausserlechner | |
| 2020/0284623 A1 | 9/2020 | Ausserlechner et al. | |

FOREIGN PATENT DOCUMENTS

| | | |
|---|---|---|
| CN | 101243326 A | 8/2008 |
| CN | 101680777 A | 3/2010 |
| CN | 101836085 A | 9/2010 |
| CN | 102435962 A | 5/2012 |
| CN | 102607405 A | 7/2012 |
| CN | 102650683 A | 8/2012 |
| CN | 106405455 A | 2/2017 |
| CN | 107121057 A | 9/2017 |
| CN | 106066461 B | 11/2019 |
| DE | 10 2004 028 309 A1 | 1/2005 |
| DE | 10 2005 052 245 A1 | 5/2006 |
| DE | 10 2015 112 464 A1 | 3/2016 |
| DE | 10 2016 102 214 A1 | 8/2017 |
| EP | 2 546 611 A1 | 1/2013 |

\* cited by examiner

MAGNETIC SENSOR DEVICE AND METHOD FOR DETERMINING A ROTATION SPEED, A DIRECTION OF ROTATION, AND/OR A ROTATION ANGLE OF A MAGNETIC COMPONENT ABOUT A ROTATION AXIS

FIELD

This disclosure relates to a magnetic sensor device and a method for determining a rotation speed, a direction of rotation, and/or a rotation angle of a magnetic component about a rotation axis.

BACKGROUND

In some automotive applications (e.g. camshaft sensing, wheel speed sensing), back biased sensors including a Hall monocell are used to sense a ferrous target wheel that rotates in front of the sensor. However, such solutions are not robust against external magnetic stray-fields. Moreover, the back bias magnet requires a complex shape (design) in order to achieve zero magnetic field at the position of the sensing Hall monocell. Moreover, leads for contacting the Hall monocell or other components of the sensor usually need to be guided around vast portions of the sensor package, so that the dimensions of the whole sensor module are large. Hence, there may be a demand for improved magnetic sensing techniques.

SUMMARY

Such a demand may be satisfied by examples described herein.

An example relates to a magnetic sensor device for determining a rotation speed, a direction of rotation, and/or a rotation angle of a magnetic component about a rotation axis. The magnetic sensor device includes a magnet being rotationally symmetrical with respect to a symmetry axis, wherein a recess is formed within the magnet along the symmetry axis. Further, the magnetic sensor device includes a first magnetic sensor element arranged within the recess and on the symmetry axis, and a second magnetic sensor element arranged within the recess and on the symmetry axis. The magnetic sensor device additionally includes an integrated circuit arranged within the recess and configured to determine the rotation speed, the direction of rotation, and/or the rotation angle of the magnetic component based on a first output signal of the first magnetic sensor element and a second output signal of the second magnetic sensor element.

Another example relates to a method for determining a rotation speed, a direction of rotation, and/or a rotation angle of a magnetic component about a rotation axis. The method includes determining a first measurement value of a magnetic field at a first measuring position within a recess formed in a magnet. The magnet is rotationally symmetrical with respect to a symmetry axis, wherein the first measuring position is located on the symmetry axis. Further, the method includes determining a second measurement value of the magnetic field at a second measuring position within the recess, wherein the second measuring position is located on the symmetry axis. The method additionally includes determining the rotation speed, the direction of rotation, and/or the rotation angle of the magnetic component based on the first measurement value and the second measurement value.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers, and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an", and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes", and/or "including," when used, specify the presence of the stated features, integers, steps, operations, processes, acts, elements, and/or components, but do not preclude the presence or addition of one or more other features, integers, steps, operations, processes, acts, elements, components, and/or any group thereof.

Unless otherwise defined, all terms (including technical and scientific terms) are used herein in their ordinary meaning of the art to which the examples belong.

Figure 1:
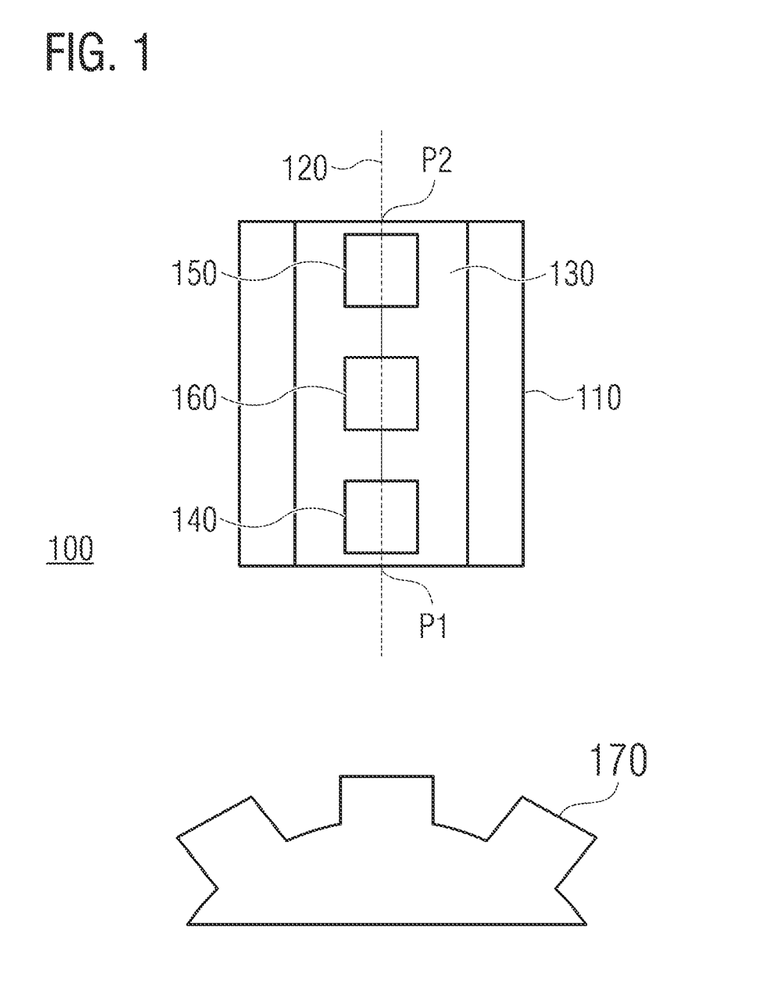
FIG. 1 illustrates an example of a magnetic sensor device for determining a rotation speed, a direction of rotation, and/or a rotation angle of a magnetic component about a rotation axis.

FIG. 1 illustrates a magnetic sensor device 100 for determining a rotation speed, a direction of rotation, and/or a rotation angle of a magnetic component 170 about a rotation axis. In the example of FIG. 1, the magnetic component 170 rotates about a rotation axis that is perpendicular to the drawing layer. The magnetic component 170 illustrated in FIG. 1 is a toothed wheel. That is, the magnetic component 170 comprises at least one tooth and an adjoining slot. For example, the magnetic component 170 may be made of ferromagnetic material.

The magnetic sensor device 100 comprises a magnet 110 that is rotationally symmetrical with respect to a symmetry axis 120. A sectional view of a ring magnet is exemplarily illustrated in FIG. 1 for illustrative purposes. However, it is to be noted that any kind of rotationally symmetrical magnet may be used (e.g. exhibiting the shape of a truncated cone). The magnet 110 is polarized along the symmetry axis. That is, the elementary magnetic moments of the magnet 110 (also known as elementary or microscopic magnets) are oriented (aligned) along the symmetry axis. In other words, the magnetic poles of the magnet 110 succeed one another along the symmetry axis 120. For example, the north pole of the magnet 110 may face the magnetic component 170 while the south pole of the magnet 110 faces away from the magnetic component 170 (north-south-magnetization), and vice versa (south-north-magnetization). A recess 130 is formed within the magnet 110 along the symmetry axis 120. As indicated in FIG. 1, the recess 130 may extend through the whole magnet 110.

Further, the magnetic sensor device 100 comprises a first magnetic sensor element 140 arranged within the recess 130 and arranged on the symmetry axis 120 (e.g. coaxial to the symmetry axis 120). Additionally, the magnetic sensor device 100 comprises a second magnetic sensor element 150 arranged within the recess 130 and arranged on the symmetry axis 120 (e.g. coaxial to the symmetry axis 120). The first and second sensor elements 140, 150 may be any kind of sensor element suitable for measuring a magnetic field. By means of the first and second sensor elements 140, 150, a first measurement value of the magnetic field at a first measuring position and a second measurement value of the magnetic field at a second measuring position are determined. Since the measuring points are located on the symmetry axis 120, the measurement is insensitive to rotations of the magnetic sensor device 100 about the symmetry axis 120. That is, the magnetic sensor device 100 is twist-insensitive.

The magnetic sensor device further comprises an integrated circuit 160 arranged within the recess 130. The integrated circuit 160 is configured to determine the rotation speed, the direction of rotation, and/or the rotation angle of the magnetic component 170 based on a first output signal of the first magnetic sensor element 140 and a second output signal of the second magnetic sensor element 150. For example, the integrated circuit 160 may be configured to determine the rotation speed, the direction of rotation, and/or the rotation angle of the magnetic component 170 based on a difference between the first output signal and the second output signal of the magnetic sensor elements 140, 150. The determination of the rotation speed, the direction of rotation, and/or the rotation angle of the magnetic component 170 based on the difference of the first and second output signals may be done according to conventional signal analysis.

The magnetic sensor device 100 uses a differential sensing principle based on the magnetic sensor elements 140, 150 and a simple rotationally symmetrical magnet 110. That is, no complicated back bias magnet is used. The magnetic field at the location of the first magnetic sensor element 140 (the one which is located close to the magnetic component 170) is modulated by the magnetic component 170, whereas the magnetic field at the second magnetic sensor element 150 (located on the opposite pole, i.e. far from the magnetic component 170) is almost not influenced by the magnetic component 170. By combining the first output signal of the first magnetic sensor element 140 and the second output signal of the second magnetic sensor element 150, the differential magnetic offset may be cancelled out. Moreover external stray-fields may be cancelled out by combining the first output signal of the first magnetic sensor element 140 and the second output signal of the second magnetic sensor element 150 since a component related to the external stray-fields is present in both signals. The magnetic sensor device 100 is further twist insensitive due to the coaxial arrangement of magnet 110 and the magnetic sensor elements 140, 150. Further, the whole sensor assembly is located inside the magnet 110. Accordingly, the magnetic sensor device 100 may be superior in terms of performance and costs. Further, it may offer a True-Power-On (TPO) capability, i.e. the magnetic sensor device 100 may determine the rotation speed, the direction of rotation, and/or the rotation angle of the magnetic component 170 immediately at start-up, since the magnetic offset may be cancelled out due to the differential sensing principle.

The magnetic sensor elements 140, 150 may be arranged symmetrically within the recess so that both magnetic sensor elements 140, 150 are exposed the same magnetic operating points. For example, an orthogonal projection of the magnet 110 onto the symmetry axis 120 (i.e. a projection in which the connecting line between a point of the magnet 110 and the corresponding projection of the point on the symmetry axis 120 is perpendicular to the symmetry axis 120) extends from a first point P1 on the symmetry axis 120 to a second point P2 on the symmetry axis 120. A minimum distance from the first magnetic sensor element 140 to the first point P1 on the symmetry axis 120 may, hence, be equal to a minimum distance from the second magnetic sensor element 150 to the second point P2 on the symmetry axis 120.

Further, the magnetic sensor elements 140, 150 may be placed close to the edges of the magnet 110. For example, the minimum distance from the first magnetic sensor element 140 to the first point P1 on the symmetry axis may less than 1%, 2%, 3%, 4%, 5%, 6%, 7%, 8%, 9%, or 10% of a distance from the first point P1 on the symmetry axis 120 to the second point P2 on the symmetry axis 120. In other words, the minimum distances from the magnetic sensor elements 140, 150 to the edges of the magnet 110 along the direction defined by the symmetry axis 120 may be less than 1%, 2%, 3%, 4%, 5%, 6%, 7%, 8%, 9%, or 10% of the extension of the magnet 110 along this direction. As a consequence, the magnetic sensor elements 140, 150 may exposed to small magnetic operating points (e.g. less than 30 mT along the direction defined by the symmetry axis 120 and substantially smaller, e.g. 3 mT or less, along directions perpendicular to the symmetry axis). An absolute vanishing of the magnetic in-plane field may be achieved where the directions perpendicular to the symmetry axis 120 cross the symmetry axis 120.

As described above, any kind of magnetic sensing principle may be used for the magnetic sensor elements 140, 150. For example, magnetoresistive sensors may be used.

That is, at least one of the first magnetic sensor element 140 and the second magnetic sensor element 150 may comprise a magnetoresistive structure. The magnetoresistive structures may be (highly) linear, i.e. exhibit a (highly) linear transfer function, if they are not operated in saturation. Accordingly, highly precise measurements may be enabled. In some examples, the magnetoresistive structure may be based on a Vortex sensor principle. That is, the magnetoresistive structure may comprise a magnetic free layer configured to generate a closed flux magnetization pattern in the magnetic free layer, and a magnetic reference layer having a non-closed flux reference magnetization pattern. Exemplary Vortex sensors are described in U.S. patent application Ser. No. 14/141,660, German patent application No. 10 2016 102 214.4, German patent application No. 10 2016 112 008.1, or German patent application No. 10 2017 112 546.9, the contents of these applications are hereby incorporated by reference in their entirety. Compared to, e.g., sensors based on the Hall-effect, Vortex based sensors offer a many times (e.g. ten times) higher sensitivity (detectability). Accordingly, a distance (air gap) between the magnetic sensor device 100 and the rotating magnetic component 170 may be increased.

However, in some examples, magnetic sensors elements based on the Hall effect may be used. That is, at least one of the first magnetic sensor element 140 and the second magnetic sensor element 150 may comprise a Hall effect region, in which the Hall effect takes place when a magnetic field is present.

Figure 2:
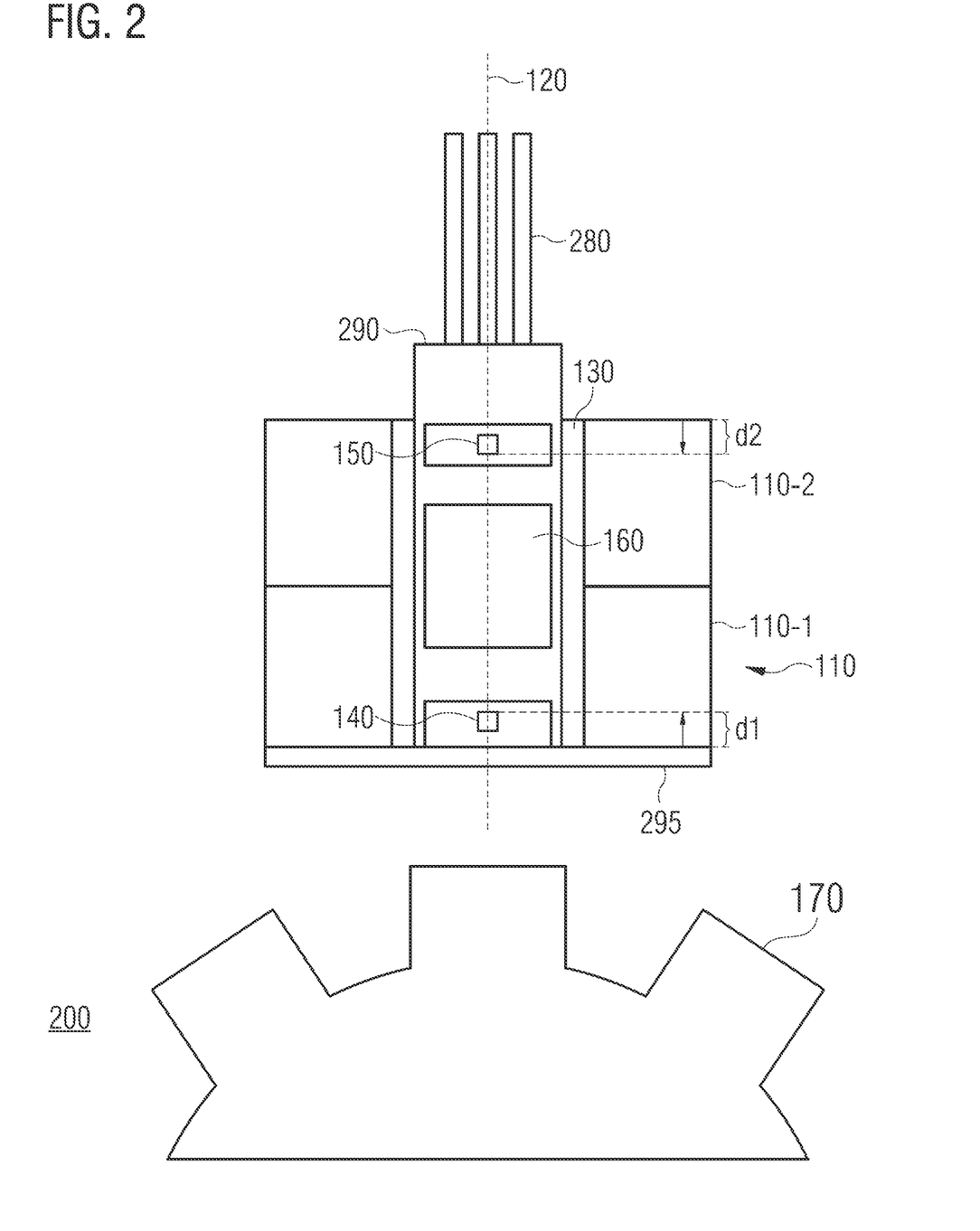
FIG. 2 illustrates another example of a magnetic sensor device for determining a rotation speed, a direction of rotation, and/or a rotation angle of a magnetic component about a rotation axis.

A more detailed example of a magnetic sensor device 200 according to the proposed architecture is illustrated in FIG. 2. The magnetic sensor device 200 comprises a ring magnet 110 (e.g. made of anisotropic ferrite) that is rotationally symmetrical with respect to symmetry axis 120. A recess 130 is formed within ring magnet 110 along the symmetry axis 120. The recess 130 extends through the whole magnet 110. The ring magnet 110 is polarized along the symmetry axis 120, which is indicated in FIG. 2 by the succession of the magnetic poles 110-1, 110-2 of the ring magnet 110 along the symmetry axis 120.

A first magnetic sensor element 140 and a second magnetic sensor element 150 are arranged within the recess 130 and on the symmetry axis 120, respectively. Accordingly, a first measurement value of the magnetic field at a first measuring position and a second measurement value of the magnetic field at a second measuring position are determined. The whole sensor assembly is, hence, located inside the magnet 110.

The magnetic sensor elements 140, 150 are arranged symmetrically within the recess so that both magnetic sensor elements 140, 150 are exposed the same magnetic operating points. Minimum distances $d_1$, $d_2$ from the magnetic sensor elements 140, 150 to the edges of the magnet 110 along the direction defined by the symmetry axis 120 are less than 1%, 2%, 3%, 4%, 5%, 6%, 7%, 8%, 9%, or 10% of the extension of the magnet 110 along this direction. As a consequence, the magnetic sensor elements 140, 150 are exposed to small magnetic operating points. This is exemplarily illustrated in FIG. 3.

Figure 3:
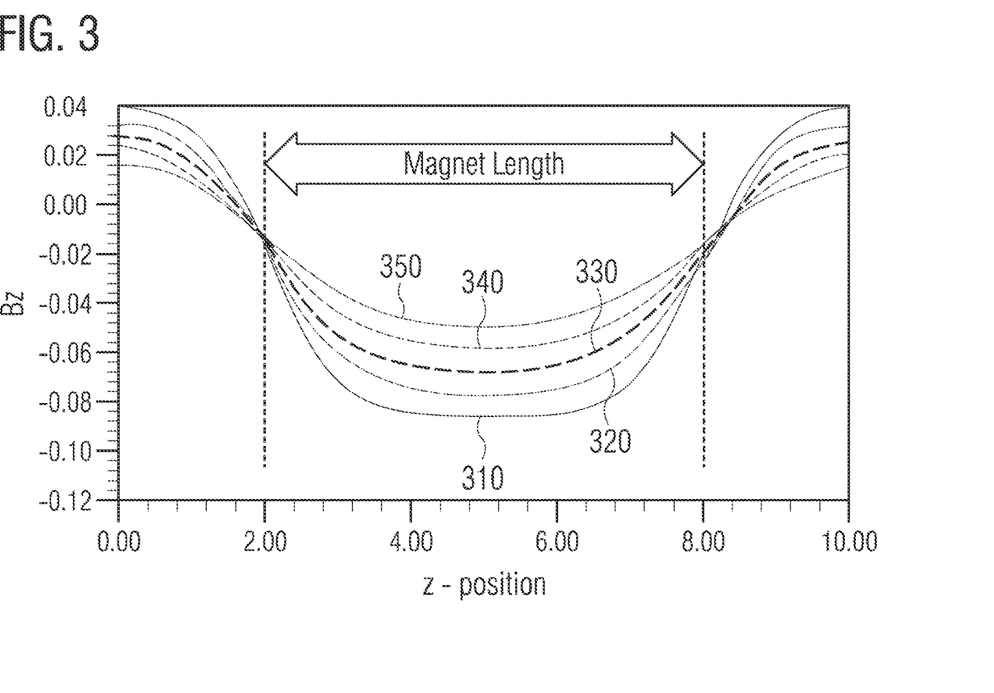
FIG. 3 illustrates an exemplary comparison of magnetic field strengths along the symmetry axis.

Assuming that the symmetry axis 120 is equal to the z-axis in a Cartesian coordinate system, FIG. 3 illustrates the magnetic field component $B_z$ along the z-axis, i.e. the symmetry axis 120, as measured by the magnetic sensor elements 140, 150 located on the z-axis. Since the magnet 110 is rotationally symmetric with respect to the z-axis and since the magnetic sensor elements 140, 150 are located on the z-axis (i.e. coaxial to the symmetry axis 120), the respective magnetic field components $B_x$, $B_y$ along the x-axis and the y-axis are zero. The strength of the magnetic field component $B_z$ is illustrated in arbitrary field strength units. Further, the positioning along the z-axis is given in arbitrary length units.

The magnetic field component $B_z$ is illustrated for different diameters of the recess 130 formed in the ring magnet 110. Lines 310 to 350 illustrate the magnetic field component $B_z$ for increasing diameters of the recess 130.

In the example of FIG. 3, the ring magnet 110 extends from z-position 2.00 in arbitrary length units to z-position 8.00 in arbitrary length units. That is, the ring magnet 110 has a length of 6.00 arbitrary length units along the z-axis. It is evident from FIG. 3 that the magnetic field component $B_z$ is decreasing towards the axial ends of the ring magnet 110, and is highest in the central part of the ring magnet 110. It is further evident from FIG. 3 that the magnetic offset (i.e. the displacement of the magnetic field component $B_z$ from zero at the edges of the ring magnet 110) decreases for increasing diameters of the recess 130.

By adjusting the distances $d_1$, $d_2$ to small values, the magnetic sensor elements 140, 150 may be exposed to small magnetic working points. Accordingly, a low drift of the offset of the magnetic field component $B_z$ may be ensured. Moreover, the diameter of the recess 130 may be selected based on the desired magnetic working point. A certain minimum diameter of the recess 130 may be ensured for placing the magnetic sensor elements 140, 150 inside the ring magnet 110. That is, the diameter of the recess 130 may be used to adjust the magnetic operation point. Further, increasing the diameter of the recess 130 may allow to decrease a sensitivity of the magnetic sensor elements 140, 150 towards (slight) displacements along the z-axis.

For example, the ring magnet 110 may exhibit a diameter of 8 mm and a height (i.e. an extension along the symmetry axis 120) of 6 mm. The recess 130 may be a hole with a hole diameter of 4 mm. The magnetic sensor elements 140, 150 may, e.g., be placed with minimum distances $d_1$, $d_2$=0.1 mm inside the magnet 110. However, it is to be noted that the above numerical example is merely for illustrative purposes and, hence, not limiting. The dimensions/distances of the individual components of the magnetic sensor device 200 may be chosen smaller and/or larger compared to the above numerical example.

The magnetic sensor device 200 further comprises an integrated circuit 160 arranged within the recess 130. The integrated circuit 160 is configured to determine the rotation speed, the direction of rotation, and/or the rotation angle of the magnetic component 170 based on a first output signal of the first magnetic sensor element 140 (indicative of the first measurement value) and a second output signal of the second magnetic sensor element 150 (indicative of the second measurement value). As discussed above, the difference between the first output signal of the first magnetic sensor element 140 and the second output signal of the second magnetic sensor element 150 may be used. The differential signal may be calculated in many ways by integrated circuit 160. For example, integrated circuit 160 may use a Wheatstone bridge or directly feed the first output signal and the second output signal to differential amplifiers.

Figure 4:
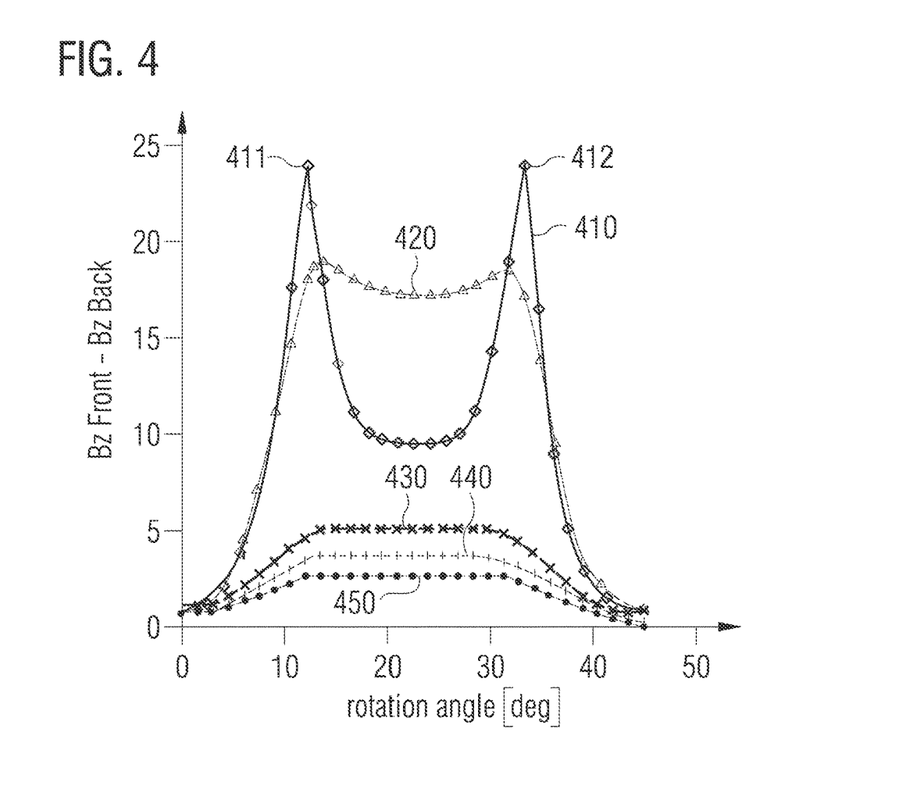
FIG. 4 illustrates an exemplary comparison of differential signals for different distances between a magnetic sensor device and a rotating magnetic component.

Exemplary differential signals are illustrated in FIG. 4. The amplitude (strength) of the differential signal is illustrated in arbitrary units for different distances (air gaps) between the magnetic sensor device 200 and the magnetic component 170. Lines 410 to 450 illustrates the differential signal for increasing distances between the magnetic sensor device 200 and the magnetic component 170.

In the example of FIG. 4, the magnetic component 170 is assumed to be a toothed wheel. FIG. 4 illustrates the rotation of the toothed wheel about its rotation axis by 50°. First (i.e. at small rotation angles), a slot is facing the magnetic sensor device 200. With increasing rotation angle, a tooth of the magnetic component 170 is facing the magnetic sensor device 200. At high rotation angles, a slot is again facing the magnetic sensor device 200. It is evident from FIG. 4 that for the different distances between the magnetic sensor device 200 and the magnetic component 170 the amplitude of the differential signal increases to maximum while the tooth passes the magnetic sensor device 200. On the other hand, the amplitude is minimal while the slot (notch) passes the magnetic sensor device 200. For the small distance 410 between the magnetic sensor device 200 and the magnetic component 170, overshoots of the tooth edges are visible. These overshoots may be avoided by increasing the distance between the magnetic sensor device 200 and the magnetic component 170. The distance between the magnetic sensor device 200 and the magnetic component 170 may generally be chosen based on the sensitivity of the magnetic sensor elements 140, 150 (e.g. increased distance for magnetic sensor elements with increased sensitivity). For example, the distance between the magnetic sensor device 200 and the magnetic component 170 may be increased if magnetic sensor elements 140, 150 comprising a Vortex based magnetoresistive structure are used compared to using magnetic sensor elements 140, 150 comprising a Hall effect region.

The distance between the magnetic sensor device 200 and the magnetic component 170 may, e.g., be increased by a spacer 295. For example, the spacer 295 may be part of package (not illustrated) that encloses the magnet 110. The package may be made of any type of mold (e.g. plastic). The spacer 295 may further serve as a holder for the magnet and sensor assembly.

In the example of FIG. 2, the first magnetic sensor element 140, the second magnetic sensor element 150, and the integrated circuit 160 are integrated on separate dies. The dies itself are arranged on a carrier 290 (e.g. a Printed Circuit Board, PCB, a lead frame, or a diepad). However, it is to be noted that arrangement of the sensing elements is not limited to this specific implementation. For example, the first magnetic sensor element 140, the second magnetic sensor element 150, and the integrated circuit 160 may be integrated on the same die, i.e. on a single die. Alternatively, the integrated circuit 160 may be integrated on a first die together with one of the first magnetic sensor element 140 and the second magnetic sensor element 150, wherein the other one of the first magnetic sensor element 140 and the second magnetic sensor element 150 is integrated on a second (satellite) die. That is, one, two, or more chips in separate packages may be mounted on carrier 290. In each of the above examples, the magnetic sensor elements are exposed to the same magnetic operating point, and stray fields may be cancelled out by the differential field calculation based on both sensor signals.

The magnetic sensor device 200 further comprises at least one electrical contact 280 (e.g. a lead) for connecting to external circuitry. The electrical contact 280 and the magnetic component 170 are arranged on opposite sides of the magnet 110. That is, magnetic sensor device 200 exhibits a top readout. For example, the one or more electrical contacts 280 may extend from a surface of the package that opposes a second surface of the package facing the magnetic component 170. The top readout may allow to avoid guidance of the electrical contact around vast portions of the magnetic sensor device 200. Accordingly, the production of the magnetic sensor device 200 may be improved in terms of required process steps, manufacturing time, and costs. Further, the dimensions of the magnetic sensor device 200 may be reduced compared to conventional techniques since the electrical contacts do not need to bend around the magnet 110. For example, an offset readout may be used in order to cope with positioning tolerances of the magnetic sensor elements 140, 150 and to enable a sample fine programmable TPO value.

The magnetic sensor device 200 may be advantageous compared to conventional architectures since the axially polarized ring magnet 110 (e.g. made of sintered ferrite) is a simple and cheap back bias magnet. Moreover, the magnetic sensor device 200 provides the same output switching behavior as conventional Hall sensors. Accordingly, it may be used with external circuitry designed for conventional Hall sensors. The top readout omits the bending of package leads, so that the assembly of the magnetic sensor device 200 may be facilitated. The simple design of the ring magnet 110 together with the top readout may enable small dimensions of the magnetic sensor device 200 (e.g. in directions perpendicular to the symmetry axis 120). Further, if Vortex based magnetic sensor elements 140, 150 are used, the distance of the magnetic sensor device 200 to the magnetic component 170 may be increased due to the higher sensitivity (detectability) compared to conventional architectures using sensors based on the Hall effect. The differential sensing principle of the magnetic sensor device 200 additionally enables stray-field robustness as well as TPO capability. The magnetic sensor device 200 is also twist insensitive since the magnetic sensor elements 140, 150 are arranged on the symmetry axis 120 (i.e. on the mechanical as well as the magnetic center of symmetry). It is evident from FIG. 4 that the magnetic sensor device 200 further enables a sufficient signal modulation.

Figure 5:
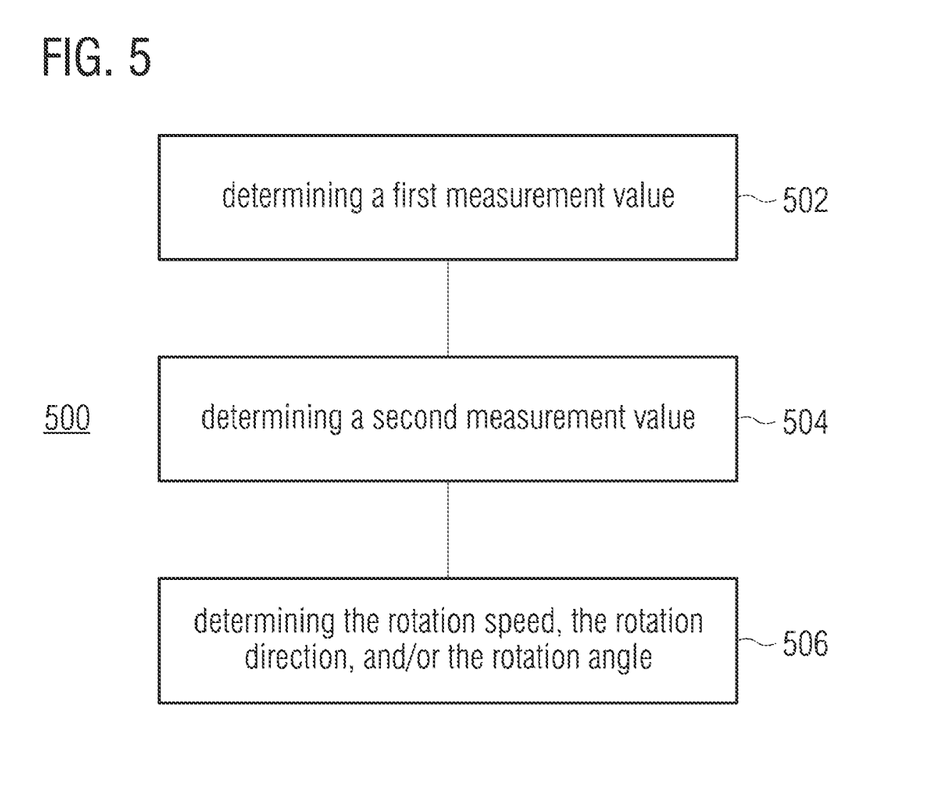
FIG. 5 illustrates a flowchart of an example of a method for determining a rotation speed, a direction of rotation, and/or a rotation angle of a magnetic component about a rotation axis.

An example of a method 500 for determining a rotation speed, a direction of rotation, and/or a rotation angle of a magnetic component about a rotation axis is illustrated by means of a flowchart in FIG. 5. The method 500 comprises determining 502 a first measurement value of a magnetic field at a first measuring position within a recess formed in a magnet. The magnet is rotationally symmetrical with respect to a symmetry axis, wherein the first measuring position is located on the symmetry axis. Further, the method 500 comprises determining 504 a second measurement value of the magnetic field at a second measuring position within the recess, wherein the second measuring position is located on the symmetry axis. The method 500 additionally comprises determining 506 the rotation speed, the direction of rotation, and/or the rotation angle of the magnetic component based on the first measurement value and the second measurement value.

As described above, determining the rotation speed, the direction of rotation, and/or the rotation angle of the magnetic component may comprise determining the rotation speed, the direction of rotation, and/or the rotation angle of the magnetic component based on a difference between the first measurement value and the second measurement value.

More details and aspects of the method are mentioned in connection with the proposed technique or one or more examples described above (e.g. FIGS. 1-4). The method may comprise one or more additional optional features corresponding to one or more aspects of the proposed technique or one or more examples described above.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic sensor device configured to determine at least one of a rotation speed, a direction of rotation, or a rotation angle of a magnetic component rotating about a rotation axis, the magnetic sensor device comprising:
    a magnet being rotationally symmetrical with respect to a symmetry axis, wherein a recess is formed within the magnet along the symmetry axis;
    a first magnetic sensor element arranged within the recess at a first location on the symmetry axis and configured to generate a first output signal;
    a second magnetic sensor element arranged within the recess at a second location on the symmetry axis and configured to generate a second output signal, wherein the first location and the second location are different; and
    an integrated circuit arranged within the recess and configured to determine at least one of the rotation speed, the direction of rotation, or the rotation angle of the magnetic component based on the first output signal and the second output signal,
    wherein an orthogonal projection of the magnet onto the symmetry axis extends from a first point on the symmetry axis to a second point on the symmetry axis, wherein a minimum distance from the first magnetic sensor element to the first point on the symmetry axis is equal to a minimum distance from the second magnetic sensor element to the second point on the symmetry axis.

2. The magnetic sensor device of claim 1, wherein the minimum distance from the first magnetic sensor element to the first point on the symmetry axis is less than 5% of a distance from the first point on the symmetry axis to the second point on the symmetry axis.

3. The magnetic sensor device of claim 1, wherein the magnet is polarized along the symmetry axis.

4. The magnetic sensor device of claim 1, wherein the recess extends through the whole magnet.

5. The magnetic sensor device of claim 1, wherein the integrated circuit is configured to determine at least one of the rotation speed, the direction of rotation, or the rotation angle of the magnetic component based on a difference between the first output signal and the second output signal.

6. The magnetic sensor device of claim 1, wherein the magnetic component comprises at least one tooth and an adjoining slot.

7. The magnetic sensor device of claim 1, wherein at least one of the first magnetic sensor element and the second magnetic sensor element comprises a magnetoresistive structure.

8. The magnetic sensor device of claim 7, wherein the magnetoresistive structure comprises:
    a magnetic free layer configured to generate a closed flux magnetization pattern in the magnetic free layer; and
    a magnetic reference layer having a non-closed flux reference magnetization pattern.

9. The magnetic sensor device of claim 7, wherein a transfer function of the magnetoresistive structure is linear.

10. The magnetic sensor device of claim 1, wherein at least one of the first magnetic sensor element and the second magnetic sensor element comprises a Hall effect region.

11. The magnetic sensor device of claim 1, further comprising:
    a package that encloses the magnet.

12. The magnetic sensor device of claim 1, further comprising:
    one or more electrical contacts for connecting to external circuitry, wherein the one or more electrical contacts and the magnetic component are arranged on opposite sides of the magnet.

13. The magnetic sensor device of claim 1, wherein the symmetry axis is perpendicular to the rotation axis.

14. The magnetic sensor device of claim 1, wherein:
    the first magnetic sensor element is configured to generate the first output signal in response to detecting a first magnetic field aligned in an axial direction of the symmetry axis, and
    the second magnetic sensor element is configured to generate the second output signal in response to detecting a second magnetic field aligned in the axial direction of the symmetry axis.

15. The magnetic sensor device of claim 1, wherein:
    a dimension of the magnet defined in an axial direction of the symmetry axis has a geometric center, and
    the first magnetic sensor element and the second magnetic sensor element are symmetrically separated from the geometric center along the symmetry axis such that the first magnetic sensor element and the second magnetic sensor element are exposed to a same magnetic operation point of the magnet.

16. The magnetic sensor device of claim 1, wherein the first magnetic sensor element and the second magnetic sensor element are sensitive to a same magnetic field component of the magnet.

17. A method for determining at least one of a rotation speed, a direction of rotation, or a rotation angle of a magnetic component rotating about a rotation axis, the method comprising:
determining a first measurement value of a magnetic field at a first measuring position within a recess formed in a magnet, wherein the magnet is rotationally symmetrical with respect to a symmetry axis, and wherein the first measuring position is located at a first location on the symmetry axis;
determining a second measurement value of the magnetic field at a second measuring position within the recess, wherein the second measuring position is located at a second location on the symmetry axis, wherein the first location and the second location are different;
determining the rotation speed, the direction of rotation, and/or the rotation angle of the magnetic component based on the first measurement value and the second measurement value,
wherein an orthogonal projection of the magnet onto the symmetry axis extends from a first point on the symmetry axis to a second point on the symmetry axis, wherein a distance from the first measuring position to the first point on the symmetry axis is equal to a distance from the second measuring position to the second point on the symmetry axis.

18. The method of claim 17, wherein determining at least one of the rotation speed, the direction of rotation, or the rotation angle of the magnetic component comprises determining at least one of the rotation speed, the direction of rotation, or the rotation angle of the magnetic component based on a difference between the first measurement value and the second measurement value.

19. The method of claim 17, wherein the distance from the first mearing position to the first point on the symmetry axis is less than 5% of a distance from the first point on the symmetry axis to the second point on the symmetry axis.

20. The method of claim 17, wherein the magnet is polarized along the symmetry axis.

21. The method of claim 17, wherein the symmetry axis is perpendicular to the rotation axis.

22. A magnetic sensor device configured to determine at least one of a rotation speed, a direction of rotation, or a rotation angle of a magnetic component rotating about a rotation axis, the magnetic sensor device comprising:
a magnet being rotationally symmetrical with respect to a symmetry axis, wherein a recess is formed within the magnet along the symmetry axis;
a first magnetic sensor element arranged within the recess at a first location on the symmetry axis and configured to generate a first output signal;
a second magnetic sensor element arranged within the recess at a second location on the symmetry axis and configured to generate a second output signal, wherein the first location and the second location are different; and
an integrated circuit arranged within the recess and configured to determine at least one of the rotation speed, the direction of rotation, or the rotation angle of the magnetic component based on the first output signal and the second output signal,
wherein the magnet comprises a first end and a second end that is arranged opposite to the first end along the symmetric axis, the first magnetic sensor is arranged at a first minimum distance from the first end, the second magnetic sensor is arranged at a second minimum distance from the second end, and the first minimum distance is equal to the second minimum distance.

23. The magnetic sensor device of claim 22, wherein:
the first end is arranged from the magnetic component by a first distance taken along the symmetric axis and the second end is arranged from the magnetic component by a second distance taken along the symmetric axis, wherein the second distance is greater than the first distance.

24. The magnetic sensor device of claim 22, wherein the first end is separated from the second end by a distance, and the first minimum distance is 10% or less than the distance between the first end and the second end.

* * * * *